United States Patent
Simons et al.

(10) Patent No.: US 7,288,155 B2
(45) Date of Patent: Oct. 30, 2007

(54) METHOD FOR THE RAPID THERMAL CONTROL OF A WORK PIECE IN LIQUID OR SUPERCRITICAL FLUID

(75) Inventors: John P. Simons, Wappingers Falls, NY (US); Kenneth J. McCullough, Fishkill, NY (US); Wayne M. Moreau, Wappingers Falls, NY (US); John M. Cotte, New Fairfield, CT (US); Keith R. Pope, Bedford, NH (US); Charles J. Taft, Wappingers Falls, NY (US); Dario Goldfarb, Mohegan Lake, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/128,022

(22) Filed: May 12, 2005

(65) Prior Publication Data

US 2005/0211269 A1    Sep. 29, 2005

Related U.S. Application Data

(62) Division of application No. 10/318,632, filed on Dec. 13, 2002, now Pat. No. 6,997,197.

(51) Int. Cl.
*B08B 3/00*  (2006.01)
*B08B 7/04*  (2006.01)

(52) U.S. Cl. .............................. 134/1; 134/1.3; 134/19; 156/345.51

(58) Field of Classification Search .................... 134/1, 134/1.3, 19; 156/345.51
See application file for complete search history.

(56) References Cited

U.S. PATENT DOCUMENTS

| | | | | |
|---|---|---|---|---|
| 5,013,366 | A | * | 5/1991 | Jackson et al. ................ 134/1 |
| 5,261,965 | A | | 11/1993 | Moslehi ......................... 134/1 |
| 5,494,526 | A | * | 2/1996 | Paranjpe ........................ 134/1 |
| 5,522,412 | A | | 6/1996 | Ohba et al. ............... 134/104.1 |
| 5,868,856 | A | * | 2/1999 | Douglas et al. ................ 134/2 |
| 6,024,801 | A | * | 2/2000 | Wallace et al. ................ 134/1 |
| 6,554,507 | B2 | | 4/2003 | Namatsu ..................... 396/611 |
| 6,596,123 | B1 | * | 7/2003 | Kwan et al. ............. 156/345.1 |
| 6,715,498 | B1 | * | 4/2004 | Humayun et al. ........... 134/1.3 |

* cited by examiner

*Primary Examiner*—Michael Barr
*Assistant Examiner*—Saeed T. Chaudhry
(74) *Attorney, Agent, or Firm*—Daniel P. Morris, Esq.; Perman & Green, LLP

(57) ABSTRACT

A method for cleaning a semiconductor structure including providing a chamber for holding the semiconductor structure and a dense phase fluid, providing a thermal transfer device having a thermal transfer surface, connecting the thermal transfer device to the chamber, placing the semiconductor structure in the chamber in contact with the thermal transfer surface and thermally cycling the thermal transfer surface.

7 Claims, 5 Drawing Sheets

METHOD FOR THE RAPID THERMAL CONTROL OF A WORK PIECE IN LIQUID OR SUPERCRITICAL FLUID

CROSS-REFERENCE TO RELATED APPLICATIONS

This application is a divisional of and claims priority from U.S. patent application Ser. No. 10/318,632, filed on Dec. 13, 2002 now U.S. Pat. No. 6,997,197.

BACKGROUND OF THE INVENTION

1. Field of the Invention

The present invention relates to a workpiece cleaning apparatus and, more particularly, to a workpiece cleaning apparatus using a dense phase fluid.

2. Prior Art

Conventional solvent based cleaning processes are continuously being looked at for alternative techniques to reduce the ill effects placed on the environment in the form of water and air pollution as well as ozone depletion. Government legislation continues to be introduced to protect the environment. Accordingly, there is an ever increasing desire to find alternative non-polluting methods of solvent based processing. The use of dense phase gases and mixtures of gases and cosolvents or surfactants is being explored. The solvent properties of compressed gases is well known. In the late 1800's, Hannay and Hogarth found that inorganic salts could be dissolved in supercritical ethanol and ether. Buchner discovered by the early 1900's, that the solubility of organics such as naphthalene and phenols in supercritical carbon dioxide increased with pressure. Within forty years Francis had established a large solubility database for liquefied carbon dioxide which showed that many organic compounds were completely miscible.

One industry that employs extensive conventional solvent based cleaning processes is semiconductor manufacturing. Future restrictive legislation on conventional solvent based processes would thus have a significant adverse impact on the industry, and ultimately on the ability of consumers to have affordable electronic devices which are desired in ever increasing numbers. By way of example, the conventional process to manufacture a semiconductor device or workpiece generally involves a silicon wafer that undergoes numerous processing steps where materials are deposited in and on the wafer. Through this repetitive processing, electrical circuits are created within the wafer. As part of the manufacturing process there are a number of cleaning steps where conventional predominately aqueous based chemistry is used to perform the "cleaning" of the surface and film at each particular step. The chemistry is selected based on its performance on the exposed structures. Conventional wafer cleaning generally employs a batch processing method due in part to the time involved to ensure that the wafer surface is sufficiently cleaned, and the possibility of minimizing the amount of conventional solvent that may be used during the cleaning process. In view of the extensive use of conventional solvents in semiconductor manufacturing, the future restrictions on use of conventional solvents, as well as the uncertainty as to the time frame and extent of those restrictions, has a major adverse impact on the industry. Accordingly, the industry desires alternatives to conventional aqueous based chemistries such as using dense phase fluids or a mixture of dense phase fluids and cosolvents for semiconductor wafer cleaning.

There are a number of consideration when seeking alternatives to conventional cleaning methods. A major consideration is the desire for the throughput rate to be as high as possible and at least equal to throughput rates of conventional processes. Generally, this can be accomplished in one of two modes. The first is a batch processing method that would be similar to the existing aqueous based equipment solutions. An alternative would be to insert the processing solution just after the existing film processor. This insertion point becomes advantageous when the typical film processors in the industry operate on a single workpiece throughput integrated. Currently, there is a desire to operate on a single workpiece process and move away from batch processing in the industry. The introduction of dense phase gases processors has the potential to be easily integrated into the desired semiconductor tooling methodology as a single workpiece processor. The challenge in this case is that it is desired that processing rates for pre film deposition cleaning and post film deposition cleaning be on the same order as the film deposition. Conventional cleaning methods using alternative solvents have however fallen well short of this goal.

U.S. Pat. No. 5,013,366 describes a cleaning process for removing contamination from a substrate wherein the substrate to be cleaned is contacted with a dense phase gas at a pressure equal to or above the critical pressure of the dense phase gas. The phase of the dense phase gases is then shifted between the liquid state and the supercritical state by varying the temperature of the dense phase fluid in a series of steps between temperatures above and below the critical temperature of the dense fluid. At each step in the temperature change, the dense phase gas possesses different cohesive energy density or solubility properties. Temperature control of the supercritical process is performed through applying the thermal changes to the processing apparatus. In this case it is applied to a large thermal mass (high pressure vessel) and as a result a considerable amount of time is used for the apparatus to achieve the target process parameters.

U.S. Pat. No. 5,261,965 describes a method and system which is based on first cooling the semiconductor wafer to a predetermined temperature in order to condense a liquid film on the semiconductor wafer surface from a condensable process gas or gas mixture. Then, the method and system promote thermally activated surface reactions and rapidly evaporate liquid film from the semiconductor wafer surface using a high peak power, short pulse duration energy source such as a pulsed microwave source to dissolve surface contaminates and produce drag forces sufficiently large to remove particulates and other surface contaminates from the surface of the semiconductor wafer. Although, the system in this case attempts to improve process times, and hence increase system throughput, the resulting system is highly complex and costly. The present invention overcomes the problems of the prior art as will be described in further detail below.

SUMMARY OF THE INVENTION

A surface cleaning apparatus comprising a chamber, and a thermal transfer device. The chamber is sized to hold a semiconductor structure therein. The thermal transfer device is connected to the chamber. The thermal transfer device has a surface disposed inside the chamber for contacting the semiconductor structure. The surface of the thermal transfer device is used for controlling a temperature of the semiconductor structure in contact with the surface. The thermal transfer device has a thermal control module connected to the surface for heating and cooling the surface to thermally cycle the surface. The thermal control module effects a substantially immediate thermal response of the surface when thermally cycling the surface.

In accordance with a method of the present invention, a method for cleaning a semiconductor structure is provided. The method comprises providing a chamber for holding the semiconductor structure, providing a thermal transfer device, connecting a thermal transfer device to the chamber, placing the semiconductor structure in the chamber, and thermally cycling part of the chamber. The chamber is provided for holding the semiconductor structure and a dense phase fluid. The thermal transfer device is provided with a thermal transfer surface, and a thermal control module connected to the thermal surface. The thermal control module heats and cools the thermal transfer surface. The thermal transfer device is connected to the chamber with the thermal transfer surface inside the chamber. The semiconductor structure is placed in the chamber in proximity to the thermal transfer surface. The thermal transfer surface is thermally cycled with the thermal control module for thermally cycling at least part of the semiconductor structure through a predetermined temperature range. The thermal control module causes a substantially immediate thermal response of the thermal transfer surface during thermal cycling.

BRIEF DESCRIPTION OF THE DRAWINGS

The foregoing aspects and other features of the present invention are explained in the following description, taken in connection with the accompanying drawings, wherein:

FIGS. 1A-1B showing the apparatus at respective times during the processing of the workpiece S;

DETAILED DESCRIPTION OF THE PREFERRED EMBODIMENT

Figure 1:
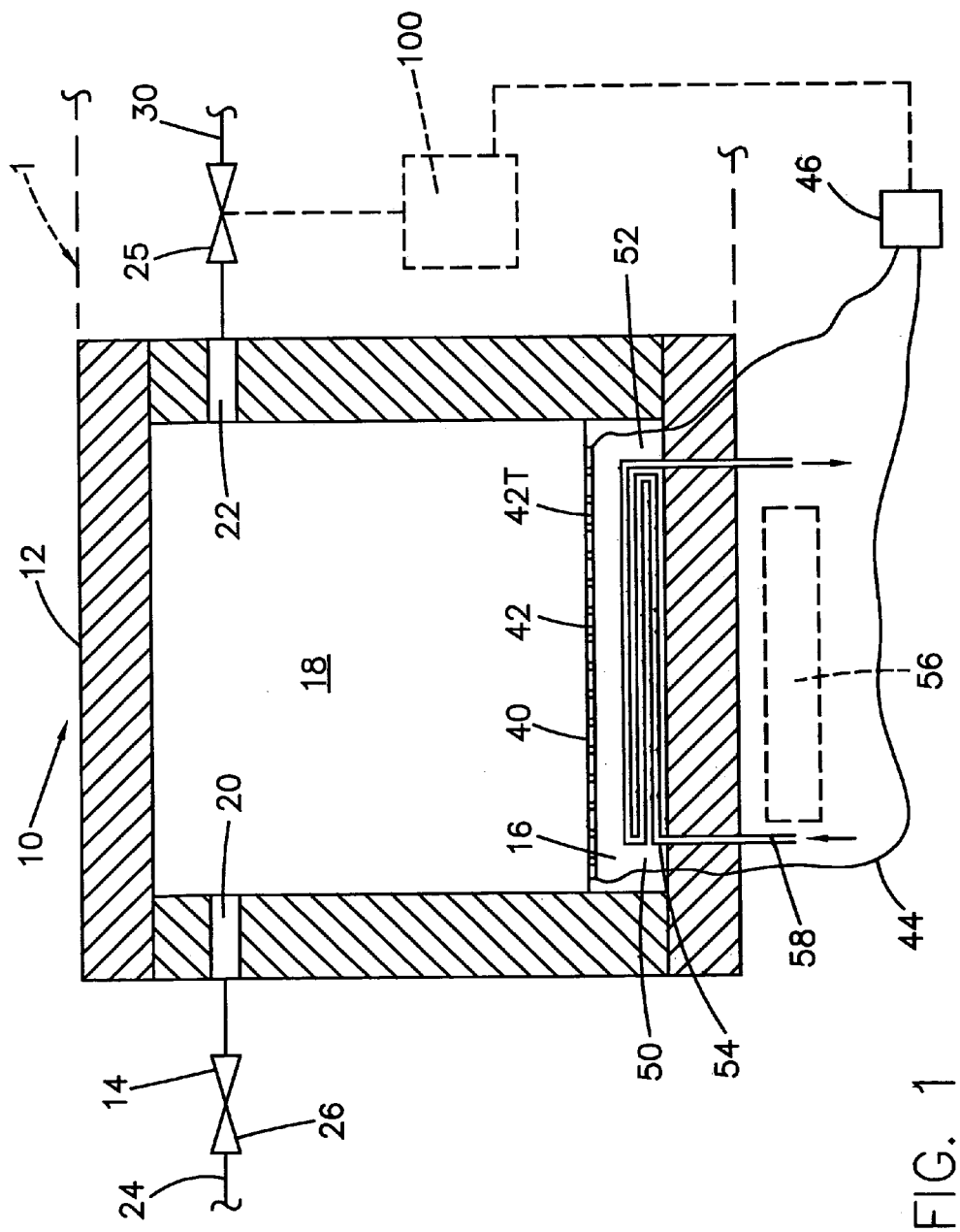
FIG. 1 is a schematic diagram of a workpiece cleaning apparatus incorporating features of the present invention.

Referring to FIG. 1, there is shown an exploded perspective view of a cleaning apparatus 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

The cleaning apparatus 10 may be integrated, or otherwise connected to a fabrication or processing apparatus 1 (only a portion of which is shown for example purposes in FIG. 1) for performing various desired processes on a workpiece. The present invention will be described below for example purposes only, with particular reference to an embodiment where the processing apparatus 1 is a fabrication apparatus for fabricating structures or devices on semiconductor wafers. The present invention however is equally applicable to any other suitable processing apparatus used for processing any other suitable workpiece such as for example flat panel displays. As can be realized, the processing apparatus 1 may include a number of processing chambers (not shown) for processing semiconductor wafers, such as for example chambers for film deposition, masking and etching. The apparatus 1 may also include suitable transporters (not shown) for moving the wafers between the processing chambers as well as to and from the cleaning apparatus 10. The processing apparatus 1 may incorporate or be connected to more than one cleaning apparatus 10, and has a controller 100 for controlling the operation of process chambers, transporters, and cleaning apparatus 10. Wafers are placed in the cleaning apparatus when desired such as before or after film deposition. The cleaning apparatus 10 generally comprises chamber 12, fluid system 14, and thermal transfer device 16. The fluid system 14 is connected to the chamber 12 to deliver and remove cleaning fluid from the chamber. The cleaning fluid is a dense phase or supercritical fluid. The thermal transfer device 16 is also connected to the chamber 12 and helps maintain the chamber at a desired temperature while thermally cycling a wafer therein to effect cleaning of the wafer as will be described in greater detail below.

Figure 2:
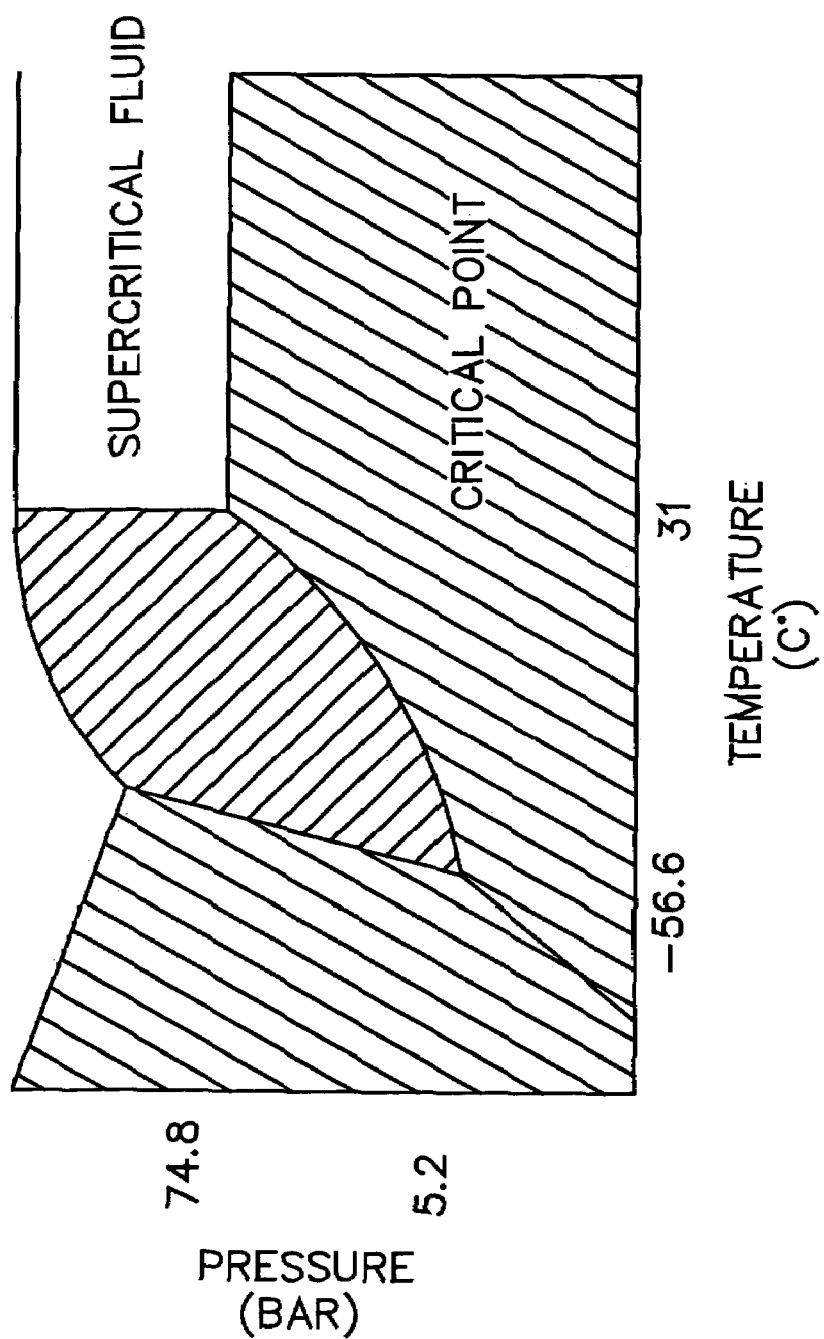
FIG. 2 is a phase diagram, according to prior art, for a fluid used in the apparatus shown in FIG. 1.

In greater detail now, and referring still to FIG. 1, the chamber 12 defines a closed plenum 18 and is constructed to withstand the conditions of the cleaning environment in the apparatus. As noted before, the cleaning apparatus uses a dense phase or supercritical fluid. In this embodiment, the fluid may be $CO_2$ or a mixture of $CO_2$ and other fluids. FIG. 2 is a phase diagram for $CO_2$ according to the prior art. The diagram in FIG. 2 shows that the critical temperature of $CO_2$ is 305° K (32° C.), and the critical pressure is 72.9 atmospheres (1073 PSI). In alternate embodiments, the fluid may be any suitable gases which may be converted to supercritical fluids, which will not degrade the structural or chemical properties of the wafers or film deposition on the wafers cleaned in the apparatus. The fluid may also be a mixture of two or more dense phase fluids selected to provide the optimal solvent properties for anticipated containments of the wafers being cleaned.

Figure 1A:
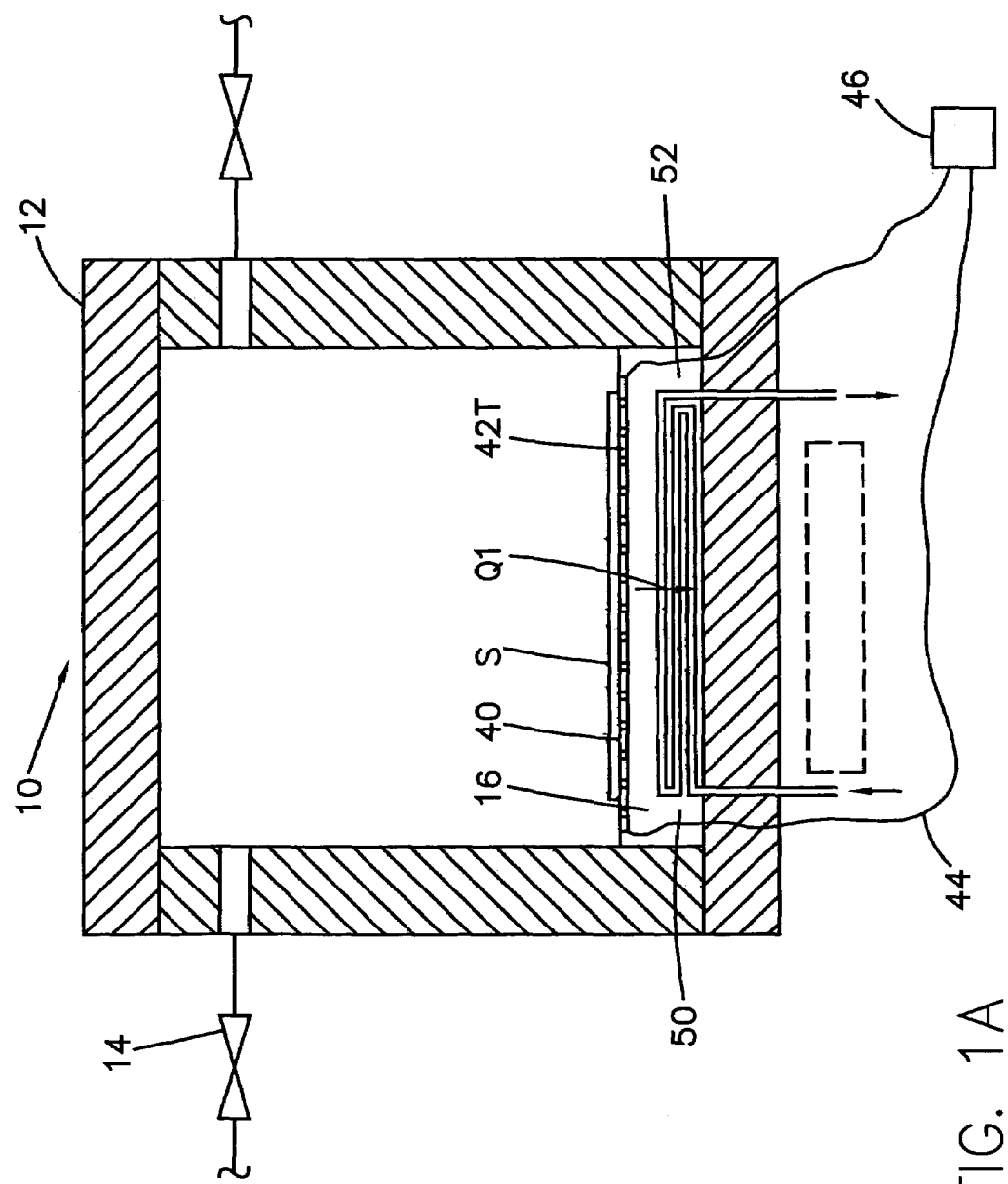
FIGS. 1A-1B are two other schematic diagrams of the workpiece cleaning apparatus in FIG. 1, and a workpiece S processed in the apparatus.
Figure 1B:
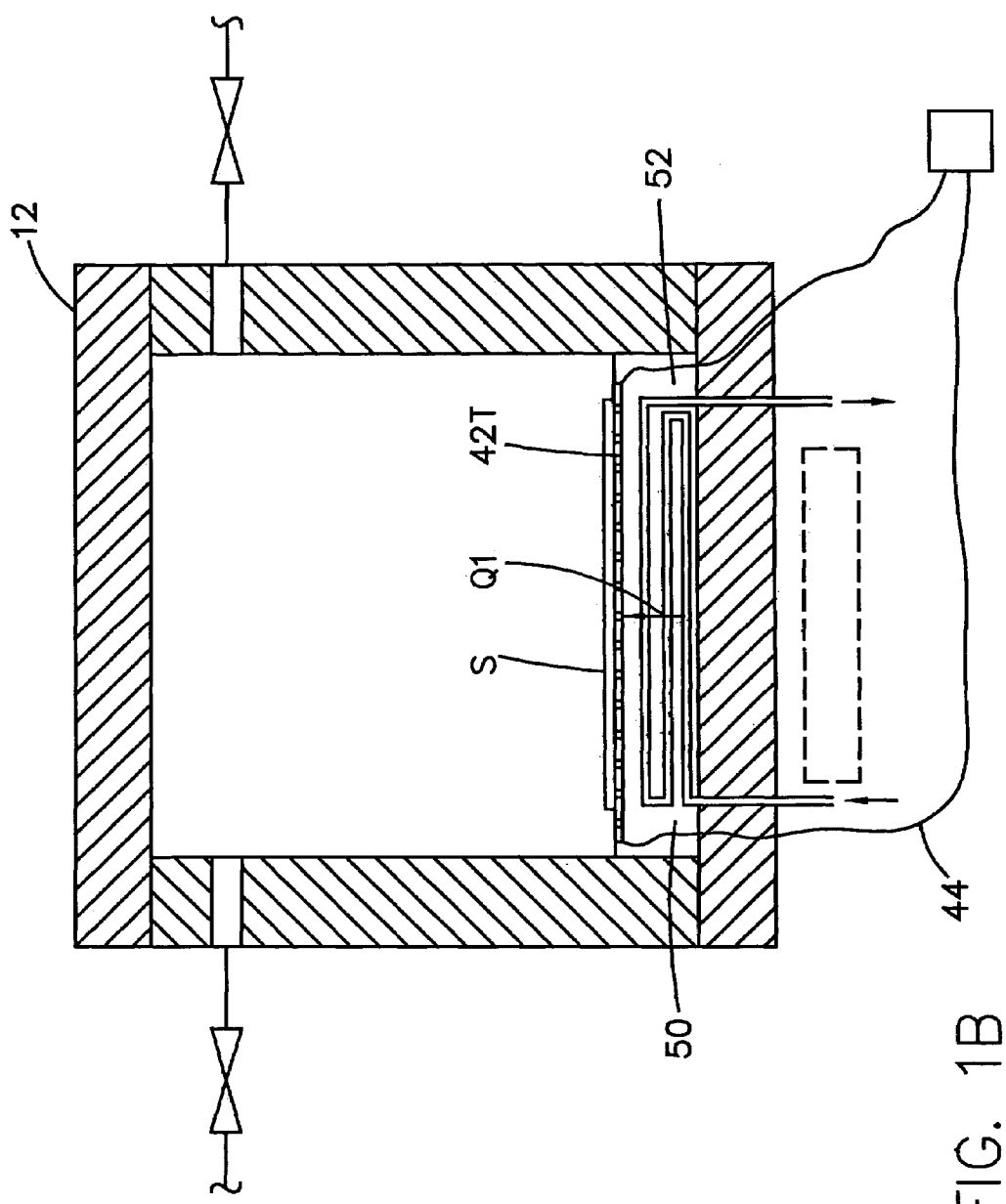

To withstand the parameters of the environment to which it will be subjected, as noted above, the vessel or chamber 12 may be made of corrosion resistant metal, such as for example stainless steel. The chamber 12 is sized to hold 200 mm or 300 mm wafers. Referring now also to FIGS. 1A-1B, the apparatus 10 in the embodiment is shown with one wafer S in the chamber 12. In alternate embodiments, the chamber of the cleaning apparatus may be sized to hold any desired number of wafers, such as for batch processing. As seen in FIG. 1, the chamber 12 may include one or more inlet ports 20 (only one port 20 is shown for example purposes) for introducing the cleaning fluid into plenum 18. The chamber 12 may include one or more outlet ports 22 (one port 22 is shown for example purposes) for drawing the cleaning fluid from the plenum 18. The chamber 12 may have a wafer opening or aperture (not shown) which allows the wafer S (see FIG. 1) to be transported into and out of the chamber.

The fluid system 14 may include a fluid supply (not shown), one or more pumps (not shown) and suitable piping 24 to connect the fluid supply to the chamber 12. The fluid system 14 may also include suitable valves 26, 28 to open and close the supply and discharge ports 20, 22 of the chamber. The valves 26, 28 may be electronically connected to the controller 100, as shown in FIG. 1, to allow the controller to open and shut the valves according to a desired processing program in the controller. The fluid supply of the fluid system 14 may hold the cleaning fluid used in apparatus 10 with the fluid in a supercritical state. Otherwise, the fluid may be stored in the fluid supply, in a liquid, or gaseous state as desired. In this case, the fluid system 14 could include a converter to convert the fluid from its stored state to the dense phase state in which the fluid is fed into the chamber 12. The fluid system 14 may be an open or closed system as desired. In the case of an open system, fluid system 14 has an exhaust section 30 (see FIG. 1) which connects the discharge port 22 of the chamber 12 to a discharge to atmosphere. This is possible when using $CO_2$ because $CO_2$ is non-toxic. When using other fluids, it may be desired to have a closed system with the discharge ports 22 of the chamber connected to the fluid supply by a return line (not shown). The return line may include appropriate scrubbers and as filters or any other suitable means for removing contaminants from the used fluid removed from the chamber 12, before returning the fluid to the supply.

Still referring to FIG. 1, the thermal transfer device 16 of the cleaning apparatus 10 generally comprises wafer contact surface 40, thermal control system 42, and thermal regulator 50. Contact surface 40 is located on side of the thermal transfer device 16 and may be formed by a casing or cover of the device. In alternate embodiments the wafer contact surface may be integrally formed with the vessel of the chamber. The wafer contact surface 40 may extend across an entire side of the plenum 18, or may be localized in a desired region. In the embodiment shown in FIG. 1, the thermal transfer device 16 is located at the bottom of chamber 12, with the contact surface 40 oriented horizontally forming the bottom surface of plenum 18. In alternate embodiments however, the thermal transfer device and its wafer contact surface, or the wafer contact surface separate from the rest of the thermal transfer device may be positioned in any other suitable position and orientation. For example, the contact surface may be vertically oriented and located along one of the lateral sides of the plenum. The wafer contact surface may also be disposed along the top of the plenum if desired. The thermal control system 42 generally comprises one or more thermo-electric module(s) 42 T, power circuit 44 and power supply 46. Only one thermo-electric module 42 T is shown in FIG. 1 for example purposes. Any suitable number of thermo-electric modules may be used depending on the size of available modules and desired area of the contact surface to be thermally controlled. Examples of suitable thermo-electric modules are available from Ferrotec America, Corp. The thermo-electric module(s) 42 T is positioned so that the outer surface of the module forms good thermal transfer contact with the contact surface 40 of the device. It is desirable, that the contact surface 40 be provided by a thermal conductive layer made from a suitable material with good thermal conductivity properties such as cooper alloys for example. The outer surface of the thermo-electric module(s) 42 T is located sufficiently close to the wafer contact surface 40 so that there is substantially no thermal lag between thermal changes of the thermo-electric module(s) surface and surface 40. In alternate embodiments, the outer surface of the thermo-electric module may itself form the wafer contact surface. In the case where more than one thermo-electric module is used in the thermal control system, the modules are mounted thermally parallel relative to the contact surface. As seen in FIG. 1, the module(s) 42 T are connected by DC circuit 44 to DC power supply 46. The power supply 46 is connected to controller 100 as shown in FIG. 1 to operate the module (s) as will be described further below.

As seen in FIG. 1 and noted above, one side of the thermo-electric module(s) 42 T contact or form the wafer contact surface 40, and the opposite surface is disposed to form good thermal contact with the casing or jacket 52 of the thermal regulator 50. The thermal regulator 50 has jacket 52 which defines thermal transfer fluid passages 54. The thermal regulator 50 also includes thermal fluid supply 56 and suitable piping or conduits 58 connecting the fluid passages 54 in jacket 52 to the supply 56. In this embodiment, the fluid jacket 52 is located within the vessel, and accordingly apertures may be formed through the vessel wall to allow passage of the supply and return sections of conduit 58 through the vessel wall to the jacket 52. In alternate embodiments however, the jacket of the thermal regulator may be included in or outside the vessel wall if desired. The thermal fluid supply 56 may have a suitable heating source (not known), such as for example a heating coil, and a suitable cooling source (not shown), such as for example a radiator or a heat sink, which are used to maintain the thermal fluid, and hence the jacket 52 at a desired temperature. The jacket 52 and fluid supply may include appropriate instrumentation (not shown) connected to the controller 100 to register thermal fluid temperatures and enable the controller to regulate the heating and cooling sources to maintain the thermal fluid at the desired temperature.

The thermal regulator 50 maintains the chamber pressure vessel, and hence the environment within plenum 18 at the desired temperature during the cleaning process. The thermo-electric module(s) 42 T are used to locally cycle the temperature of the wafer contact surface 40 by moving heat from or to the surface 40. The thermal regulator 50 operating at the steady state desired temperature complements the cyclic operation of the thermo-electric module(s) 42 T. The thermal regulator 50 removes heat drawn from the wafer contact surface 40 by the module(s) 42 T, and supplies heat when the module(s) 42 T heat the surface 40. By way of example, the desired temperature of the chamber 12 and its contents may be a temperature at or above 305° K (32° C.), the critical temperature of the $CO_2$ cleaning fluid (see FIG. 2). Accordingly, the temperature of the thermal regulator 50 may be set in a range about the chamber desired temperature (accounting for outer heat losses/gains of chamber 12) to maintain the chamber at its desired temperature. During the cleaning process, the thermal-electric module(s) 42. T may be energized (by directing current through circuit 44 in a desired direction) to cool the wafer contact surface 40 to a temperature below the critical temperature of the $CO_2$ fluid. The chamber 12 is shown in this condition in FIG. 1A. The substantially no thermal lag between the thermal change of the cooling outer surface of the thermo-electric module(s) 42 T and the thermal change of surface 40 ensures that the temperature of the contact surface 40 drops immediately as the thermo-electric module(s) is energized. As seen in FIG. 1A, operation of the thermo-electric module(s) 42 T to cool surface 40, causes the thermo-electric module(s) to drain heat (indicated by arrow Q1 in FIG. 1A) away from surface 40. The thermo-electric module(s) outer surface (opposite the cooling surface) in contact with the thermal regulator jacket 52 is heated, the heat Q1 is transferred via contact with the jacket 52 to the thermal regulator 50 and is subsequently removed by the thermal transfer fluid of the regulator. To complete the cycle, the thermo-electric module (s) 42T is energized (by reversing the direction of current through circuit 44) to rapidly heat the contact surface 40 back to or above the critical temperature of the cleaning fluid. The chamber 12 is shown in this condition in FIG. 1B. In this case, heat is moved by the module(s) 42 T (in the direction indicated by arrow Q2 in FIG. 1B) to the contact surface 40 of the chamber 12. The outer surface of the module(s) 42 T in contact with jacket 52 of the thermal regulator is cooled, while the outer surface in contact with surface 40 is heated. The thermal regulator 50 replenishes the heat moved by the thermo-electric module(s) 42 T to the contact surface 40.

Figure 3:
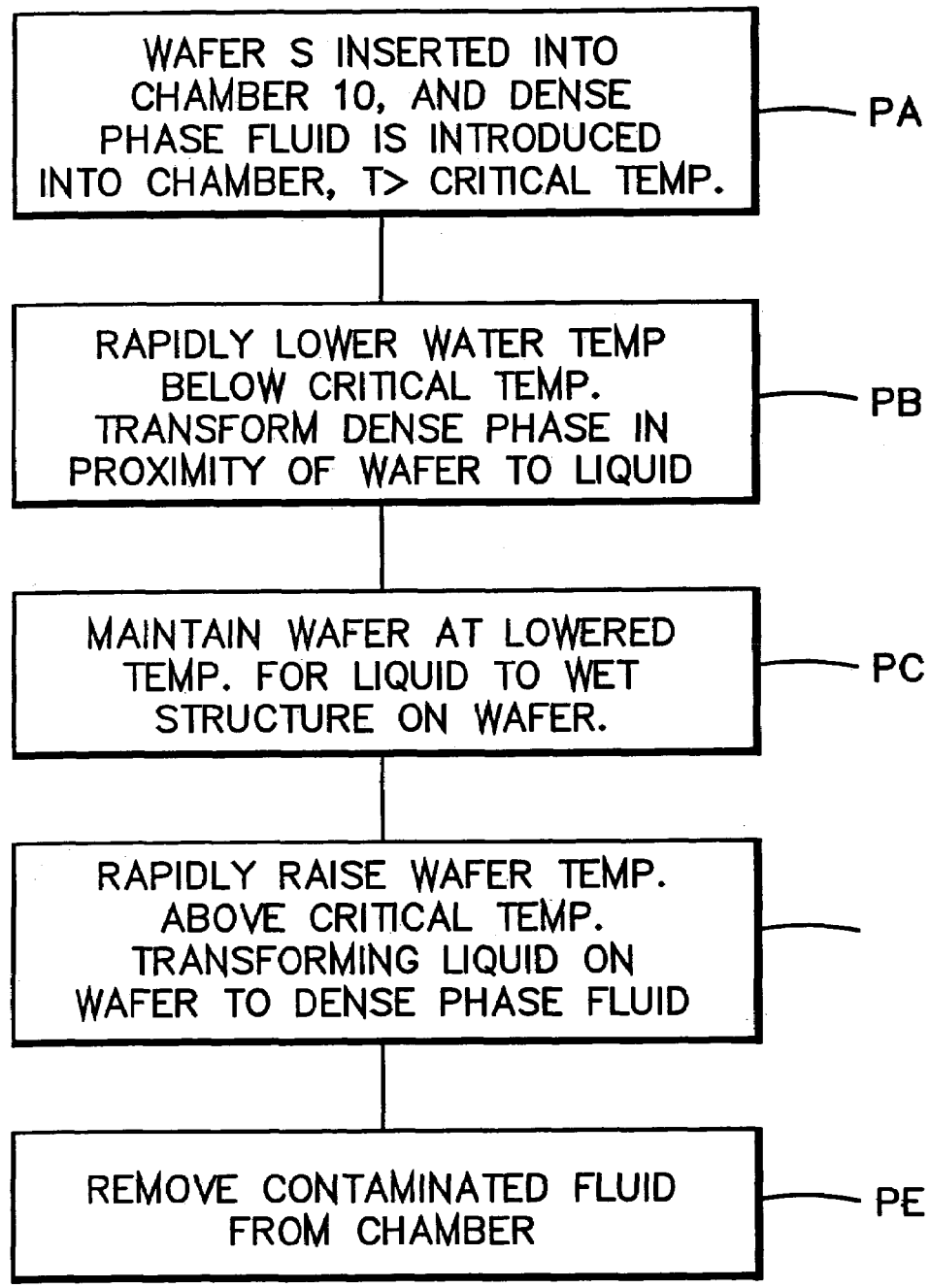
FIG. 3 is a flow chart graphically depicting a cleaning method used with the cleaning apparatus shown in FIG. 1.

FIG. 3 is a flow chart graphically depicting the cleaning method used with cleaning apparatus 10 for cleaning a wafer S. The sequence shown in FIG. 3 is merely exemplary, and in alternate embodiments the steps of the cleaning method may be performed in any desired order. As seen in FIG. 1A, the wafer S to be cleaned, is transported into the chamber 12 from the processing apparatus 1 (block PA in FIG. 3). The wafer S is positioned in the chamber to place the wafer S in contact with contact surface 40. The chamber temperature may be equal to or higher than the critical temperature of the dense phase fluid. The dense phase fluid is fed into the chamber 12 from fluid system 14. In block PB of the flow chart in FIG. 3, the temperature of the wafer S is lower rapidly to a temperature below the critical temperature of the dense phase fluid. This is done by rapidly cooling the contact surface 40 locally with the thermo-electric module(s) 42 T as described before. As the wafer temperature falls below the critical temperature, the dense phase fluid in contact with the surface of the cooled wafer changes phase to a liquid. The temperature of the wafer S is maintained at the lowered level (block PC) for the liquid in contact with the wafer to wet the surface of wafer S. Capillary action draws liquid into the structure formed on the wafer S. In block PD, the wafer S is rapidly heated back to the temperature above the critical temperature of the cleaning fluid. The wafer S is heated by rapidly heating the contact surface 40 locally with the thermo-electric module(s) 42 T as also described before. Raising the wafer temperature above the critical temperature causes the liquid on the wafer S to change phase back to a dense phase fluid. After transitioning to a dense phase fluid, the temperature of the dense phase fluid in immediate proximity of the wafer S continues to rise with the rising temperature of the wafer. As the fluid temperature rises, the diffusivity of the fluid increases such that the contaminants on the surface of the wafer S are miscible in the fluid. The contaminated cleaning fluid may then be drawn off using system 14 (block PE). The cleaned wafer S may then be removed from the cleaning apparatus for post cleaning operation.

The cleaning apparatus 10 and method use thermoelectric technology to provide a means to control dense gas phase changes. The cleaning apparatus 10 allows for rapid thermal changes to be applied directly to a workpiece and the surrounding dense phase gas. This ability to apply a rapid temperature change is used advantageously in the cleaning by directly applying phase shifting energy compared to the conventional mechanical techniques.

The cleaning apparatus 10 provides a phase transition from liquid to supercritical and liquid to solid with a minimum amount of energy transfer by avoiding the typical transfer of conditioning a high pressure vessel to the desired operating temperature. In the cleaning apparatus 10, thermal phase transitions can be applied directly to the work piece within minutes verses hours in the conventional process to bring a large stainless steel pressure vessel to the required processing temperatures.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for cleaning a semiconductor structure, the method comprising:
providing a chamber for holding the semiconductor structure and a dense phase fluid;
providing a thermal transfer device with a thermal transfer surface, and a thermal control module connected to the thermal transfer surface, the thermal control module heating and cooling the thermal transfer surface;
connecting the thermal transfer device to the chamber with the thermal transfer surface inside the chamber;
placing the semiconductor structure in the chamber in contact with the thermal transfer surface; and
thermally cycling the thermal transfer surface with the thermal control module for thermally cycling at least part of the semiconductor structure through a predetermined temperature range, the thermal control module causing a substantially immediate thermal response of the thermal transfer surface during thermal cycling.

2. The method according to claim 1, further comprising introducing the dense phase fluid in the chamber.

3. The method according to claim 2, wherein thermal cycling of at least part of the semiconductor structure through the predetermined temperature range effects a localized phase change of the dense phase fluid at a surface of the semiconductor structure.

4. The method according to claim 1, further comprising maintaining the thermal transfer device at a predetermined temperature with a thermal regulator when the thermal transfer surface is thermally cycled be the thermal control module.

5. A method for cleaning a semiconductor structure, the method comprising:
providing a chamber for holding the semiconductor structure and a dense phase fluid;
providing a thermal transfer device with a thermal transfer surface, and a thermal control module connected to the thermal transfer surface, the thermal control module heating and cooling the thermal transfer surface;
providing a thermal regulator, the thermal regulator maintaining the thermal transfer device at a predetermined temperature;
connecting the thermal transfer device to the chamber with the thermal transfer surface inside the chamber;
placing the semiconductor structure in the chamber in contact with the thermal transfer surface; and
thermally cycling the thermal transfer surface with the thermal control module for thermally cycling at least part of the semiconductor structure through a predetermined temperature range, the thermal control module causing a substantially ixmztediate thermal response of the thermal transfer surface during thermal cycling, the thermal regulator causing a heat sink when the thermal control module is cooling the surface of the thermal transfer device, the thermal regulator causing a heat source when the thermal control is heating the surface of the thermal transfer device.

6. The method according to claim 5, further comprising introducing the dense phase fluid in the chamber.

7. The method according to claim 6, wherein thermal cycling of at least part of the semiconductor structure through the predetermined temperature range effects a localized phase change of the dense phase fluid at a surface of the semiconductor structure.

* * * * *